(12) United States Patent
Canard et al.

(10) Patent No.: US 8,963,750 B2
(45) Date of Patent: Feb. 24, 2015

(54) TIME-TO-DIGITAL CONVERSION WITH ANALOG DITHERING

(71) Applicant: Asahi Kasei Microdevices Corporation, Toyko, PA (US)

(72) Inventors: David Canard, Colombelles (FR); Julien Delorme, Colombelles (FR)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/258,102

(22) Filed: Apr. 22, 2014

(65) Prior Publication Data

US 2014/0320324 A1    Oct. 30, 2014

(30) Foreign Application Priority Data

Apr. 24, 2013  (EP) ..................... 13305539

(51) Int. Cl.
*H03M 1/20* (2006.01)
*H03L 7/093* (2006.01)

(52) U.S. Cl.
CPC .............. *H03M 1/201* (2013.01); *H03L 7/093* (2013.01)
USPC ........... 341/131; 341/118; 341/115; 341/155; 327/107; 327/156; 327/157; 327/158; 327/159; 375/294; 375/327; 375/360; 375/376; 331/16; 331/17; 331/18; 331/179; 331/1 A; 455/109; 455/285; 455/302; 455/570

(58) Field of Classification Search
CPC ........ H03B 12/00; H03B 1/69; G04F 10/005; H03L 2207/50; H03L 7/091; H03L 7/099; H03L 7/16; H03L 7/113; H03L 7/1806; H03L 7/0991; H03M 3/43; H03M 3/456

USPC .................. 341/115, 118, 131, 155; 327/107, 327/156–159; 331/1 A, 16, 17, 18, 179; 375/294, 327, 360, 376; 455/109, 302, 455/285, 570

See application file for complete search history.

(56) References Cited

U.S. PATENT DOCUMENTS

| | | | | |
|---|---|---|---|---|
| 7,205,924 B2 * | 4/2007 | Vemulapalli et al. | ......... | 341/166 |
| 7,570,182 B2 * | 8/2009 | Sheba et al. | ......... | 341/118 |
| 7,920,081 B2 * | 4/2011 | Waheed et al. | ......... | 341/118 |
| 7,940,099 B2 * | 5/2011 | Weltin-Wu et al. | ......... | 327/159 |
| 7,983,375 B2 * | 7/2011 | Dulger et al. | ......... | 375/376 |
| 8,054,116 B2 * | 11/2011 | Ballantyne | ......... | 327/158 |
| 8,111,180 B2 * | 2/2012 | Wiesbauer et al. | ......... | 341/143 |
| 8,198,929 B2 * | 6/2012 | Pellerano et al. | ......... | 327/158 |

(Continued)

FOREIGN PATENT DOCUMENTS

WO    2009/094398 A1    7/2009

OTHER PUBLICATIONS

Extended European Search Report dated Nov. 4, 2013 for European Application No. 13305539.2.

*Primary Examiner* — Lam T Mai
(74) *Attorney, Agent, or Firm* — Morgan, Lewis & Bockius LLP

(57) ABSTRACT

There is described a time-to-digital conversion scheme using an arrangement of delay elements based Time-to-Digital Converter, TDC (20), wherein dithering is built in the digital domain and introduced in the analog domain as a modulation of a supply voltage (TDC-supply) supplying delay elements of the TDC, each having a propagation delay which exhibits a dependency to their supply voltage.

15 Claims, 3 Drawing Sheets

CONTROL INPUTS

(56) References Cited

U.S. PATENT DOCUMENTS

| | | | |
|---|---|---|---|
| 8,344,918 B2 * | 1/2013 | Baudin et al. | 341/115 |
| 8,552,767 B1 * | 10/2013 | Nikaeen et al. | 327/105 |
| 8,618,967 B2 * | 12/2013 | Nikaeen et al. | 341/143 |
| 2002/0093445 A1 | 7/2002 | Watanabe | |

* cited by examiner

TIME-TO-DIGITAL CONVERSION WITH ANALOG DITHERING

This application claims the priority and benefit of European patent no. 13305539.2 to Asahi Kasei Microdevices Corporation of Japan, entitled "Time-To-Digital Conversion With Analog Dithering," filed Apr. 24, 2013, which is hereby incorporated by reference in its entirety.

TECHNICAL FIELD

The invention relates generally to a phase-locked loop (PLL) device that is provided with synchronization capabilities. The invention also relates to processes for operating such a PLL device, and operating simultaneously several such PLL devices.

BACKGROUND OF THE INVENTION

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

A Time-to-Digital Converter (TDC) is an electronic device commonly used to measure a time interval between two events, namely the time between a start event and a stop event, and to convert it into a digital (binary) output value.

TDCs have become more and more popular in the circuit design community, and are used in an increasing number of applications for the design of various signal processing systems. For instance, in all-digital Phase-Locked Loops (PLL) used in frequency synthesizers, a TDC may serve as a phase detector. Other applications include TDC based Analog-to-Digital Converters (ADC).

Compared to original analog realizations that are based on a traditional approach that time-to-digital conversion is obtained by first converting the time interval into a voltage and then by digitizing this voltage by a conventional ADC, fully digital solutions are by far more robust.

For instance, the principle of operation of such fully digital solutions as counter based TDCs relies on the idea that the best solution to quantize a time interval is to count the cycles of a reference clock fitting into the interval. However, the interval to be measured is defined by the start and stop signals, which are completely asynchronous to the reference clock signal. This causes a measurement error at the beginning and at the end of the time interval. The measurement accuracy can be increased by using a higher clock frequency. However, increasing the clock frequency results in higher power consumption for the generation and processing of the clock signal.

Therefore, an alternative to the above counter based TDCs uses a digital delay-line. In such a digital delay-line based TDC, the start signal is fed into a delay-line comprising a chain of cascaded delay elements, such as logic gates connected in series. Thus, the start signal is delayed along the delay-line with each delay element generating a delayed version of the start signal. On the arrival of the stop signal, the delayed versions of the start signal are sampled in parallel. A thermometric-to-binary encoder then generates the digital binary TDC output value from the thermometric value defined by the set of samples. Either latches or flip-flops can be used as sampling elements. The resolution then depends on the delay of the delay elements in the chain.

The total noise from such a TDC is the sum of the quantization noise coming from its limited resolution and the analog jitter added at each transition of its logic gates.

In some applications, it is possible to use noise shaping techniques so that the quantization noise power is rejected towards high frequencies. This is particularly suited in the case of digital PLLs because the noise performance is ideally limited by the analog jitter sources only.

However, some quantization noise can still appear at low frequencies because of imperfect noise shaping.

As shown by the spectrum diagram of FIG. 1, which illustrates the power density L(f) at the output of a VCO as a function of the offset frequency f of the PLL, this can result in spurs 11 on the output spectrum when used in a digital PLL.

Dithering techniques can be used to avoid such problems and thus optimize the noise shaping performance.

A possible solution is to add digital noise at the output of the TDC encoder. This noise may be generated by pseudo random generators. An expected drawback of this solution, however, is that the added noise can be significantly stronger than the intrinsic analog performance of the TDC.

The present invention solves the disadvantages of the prior art by disclosing a device with analog dithering, for converting a time interval between an active edge of a first signal and an active edge of a second signal into a binary output value.

The present invention aims at providing an alternative solution for performing time-to-digital conversion with dithering.

Basically, the proposed solution is based on the observation that any delay-line based time-to-digital conversion mechanism consists in expressing a time difference as a number of propagation delays stemming from logic gates through which the start signal propagates until the stop signal occurs. Often, the TDC is built from logic gates whose propagation delay exhibits a dependency to the supply voltage. This is the case at least when standard logic gates are used. Thus, modulating the supply voltage will simultaneously modulate the conversion gain and introduce dithering into the conversion mechanism.

BRIEF SUMMARY

To achieve these and other objects of the invention, in some embodiments a time-to-digital conversion device with analog dithering, configured to convert a time interval between an active edge of a first signal and an active edge of a second signal into a binary output value, comprises a time-to-digital converter, TDC, comprising an arrangement of a number Q of cascaded delay elements ($G_1$-$G_Q$) each having a propagation delay that exhibits a dependency to a supply voltage, the arrangement receiving the first signal in input; a set of Q sampling elements configured to generate Q sample values by sampling respective outputs of the Q delay elements responsive to the active edge of a second signal; an encoder configured to generate the binary output value (TDC_output) from the Q sample values; and a dithering arrangement comprising a digital dithering signal generator, configured to generate a dithering signal (DS) in the digital domain; and a supply voltage generator configured to generate the supply voltage of the delay elements of the TDC, with respect to the dithering signal.

In some embodiments, the dithering signal generator is configured to generate the dithering signal as a sum of at least two periodic waveforms (TS1,TS2) in the digital domain.

In some embodiments, an amplitude and/or fundamental frequencies of the periodic waveforms are programmable.

In further embodiments, the dithering signal generator comprises digital generators configured to provide binary values of the periodic waveforms, respectively, and a digital summing circuit configured to generate the dithering signal by summing respective binary values of the periodic waveforms.

In some embodiments, the periodic waveforms are triangle signals.

In other embodiments, the supply voltage generator comprises a Digital-to-Analog Converter (DAC), coupled to the dithering signal generator for receiving the dithering signal; a low-pass filter coupled to the DAC configured to receive an analog translated dithering signal; and a power stage coupled to the low-pass filter and configured to generate the TDC supply voltage with respect to the low pass filtered analog translated dithering signal.

In some embodiments, the low-pass filter is programmable.

Another embodiment of the present invention is a method of time-to-digital conversion with analog dithering, for converting a time interval between an active edge of a first signal and an active edge of a second signal into a binary output value using a time-to-digital converter, TDC, comprising an arrangement of a number Q of cascaded delay elements ($G_1$-$G_Q$) each having a propagation delay that exhibits a dependency to a supply voltage, the arrangement receiving the first signal in input; a set of Q sampling elements configured to generate Q sample values by sampling respective outputs of the Q delay elements responsive to the active edge of a second signal; and an encoder configured to generate the binary output value (TDC_output) from the Q sample values; the method comprising: generating a dithering signal (DS) in a digital domain; and generating the supply voltage of the delay elements of the TDC, with respect to the dithering signal.

In some embodiments, the dithering signal is generated as a sum of at least two periodic waveforms (TS1,TS2) in the digital domain.

In some embodiments, an amplitude and/or fundamental frequencies of the periodic waveforms are programmable.

In further embodiments, the dithering signal is generated by summing respective binary values of the periodic waveforms.

In some embodiments, the periodic waveforms are triangle signals.

In some embodiments, generating the supply voltage of the delay elements of the TDC supply voltage generator comprises digital-to-analog converting the dithering signal; low-pass filtering the analog translated dithering signal; and generating the TDC supply voltage with respect to the low pass filtered analog translated dithering signal.

In some embodiments, low-pass filtering the analog translated dithering signal is carried out using a programmable low-pass filter configured to convert a time interval between an active edge of a first signal and an active edge of a second signal into a binary output value, comprises a time-to-digital converter, TDC, comprising an arrangement of a number Q of cascaded delay elements ($G_1$-$G_Q$) each having a propagation delay that exhibits a dependency to a supply voltage, the arrangement receiving the first signal in input; a set of Q sampling elements configured to generate Q sample values by sampling respective outputs of the Q delay elements responsive to the active edge of a second signal; an encoder configured to generate the binary output value (TDC_output) from the Q sample values; and a dithering arrangement comprising a digital dithering signal generator, configured to generate a dithering signal (DS) in the digital domain; and a supply voltage generator configured to generate the supply voltage of the delay elements of the TDC, with respect to the dithering signal.

The above mentioned first signal is the signal (or set of signals) carrying the timing information to be converted, referred to as the start signal in the present description. The second signal is a sampling signal adapted to freeze the delaying of the first signal and trigger the time-to-digital conversion, which is referred to as the stop signal in the present description.

Hence, the proposed dithering relies on supply voltage modulation built in the digital domain, for instance by summing binary values of one or more periodic waveforms, for instance triangle signals.

Though being digitally generated and controlled, dithering is added in the analog domain, namely through variation of propagation delay of the delay element which results from modulation of their supply voltage. Therefore, it does not introduce new quantization and aliasing noise, as would dithering that would be added in the digital domain.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention. In the drawings.

Same reference numbers which are indicated in different ones of these figures denote identical elements of elements with identical function. In addition, components with well-known functions and operation but not connected directly to the invention features are not described in detail.

DETAILED DESCRIPTION OF THE INVENTION

Reference will now be made in detail to embodiments, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present invention and the subject matter may be practiced without these specific details.

Figure 1:
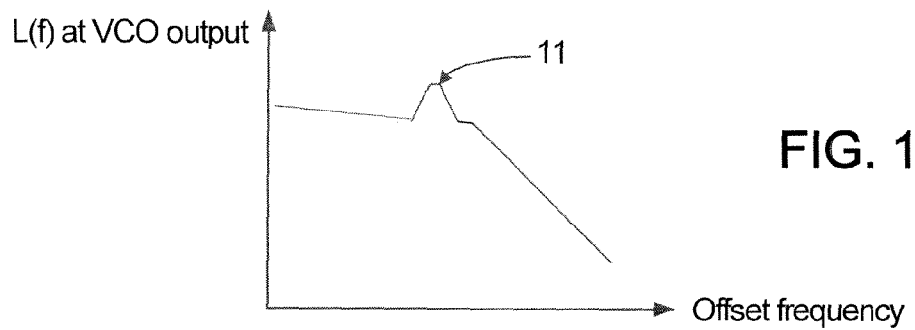
FIG. 1 is a spectrum diagram illustrating the power density at the output of the VCO of a PLL as a function of the offset frequency of the PLL in the case where excess quantization noise is present according to related art.
Figure 2:
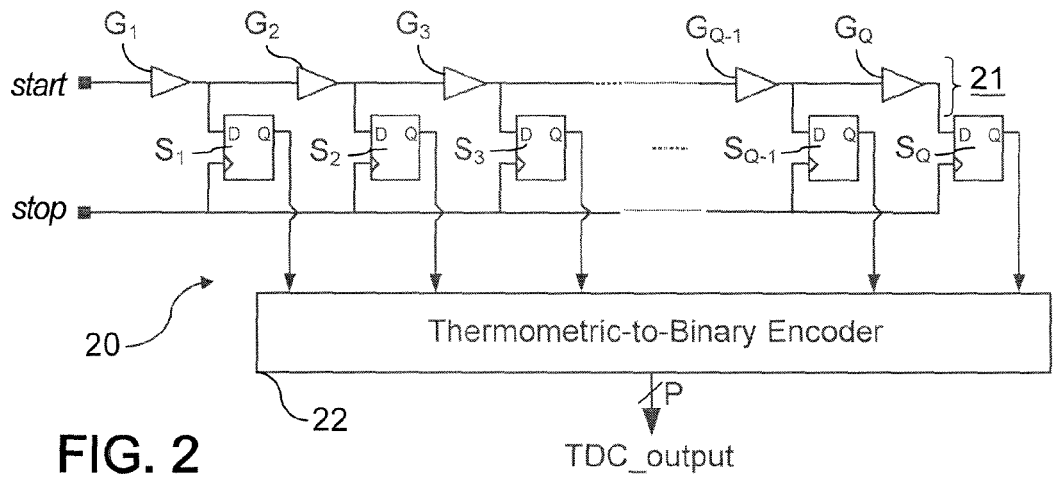
FIG. 2 is a schematic block diagram of a TDC to which embodiments of the present invention may be applied.

Referring to FIG. 2, there is shown therein a schematic circuit diagram of an example of a Time-to-Digital Converter (TDC) 20 to which embodiments of the invention may be applied. The TDC is based on a tapped delay-line structure 21, in which the start signal is fed. The start signal is the signal carrying the time information to be converted.

The tapped delay-line 21 contains a number Q of delay elements, or cells, each introducing an elementary delay time r. For instance, the delay elements are logic gates $G_1$ to $G_Q$ cascaded in series. The logic gates $G_1$-$G_Q$ may be of any type suitable for the application, for instance pass-gates, inverters, buffers, NAND-gates or NOR-gates conveniently arranged.

It will be appreciated that some TDC systems are not based on a delay line, but the principle of the innovation described herein applies to them anyway, to the extent that they comprise an arrangement of a number Q of delay elements each introducing an elementary delay time $\tau$.

When propagating through the delay-line, the start signal is delayed. More precisely, there may be generated up to Q delayed versions of the start signal.

The TDC further comprises a number Q of sampling elements $S_1$ to $S_Q$, which are respectively connected to the outputs of the delay elements $G_1$ to $G_Q$. In the shown example, the sampling elements $S_1$-$S_Q$ are flip-flops, such as D-flip-flops. It will be appreciated, however, that any other devices suitable for the specific application can be used as sampling elements, such as latches, for example, D-latches.

The sampling elements $S_1$-$S_Q$ are adapted to sample the state of the delay-line on the rising edge of the stop signal. Stated otherwise, the sampling process freezes the state HIGH or LOW of the delay elements of the delay-line at the point in time where the stop signal occurs. The stop signal is used as a sampling signal adapted to freeze the delaying of the start signal and trigger the time-to-digital conversion as such.

In some applications, the active edge of the stop signal drives a high number of flip-flops, and a buffer-tree (not shown) may be used to provide sufficient driving capability.

When the active edge of the stop signal occurs, the start signal has propagated through the line of delay elements, and has been delayed by a certain number k of them, where k≤N. The state of the delay-line is sampled at the time of arrival of the active edge of the stop signal. The output of each flip-flop $S_1$-$S_Q$ is sampled on the fly. The stop signal latches all flip-flop outputs.

Figure 3:
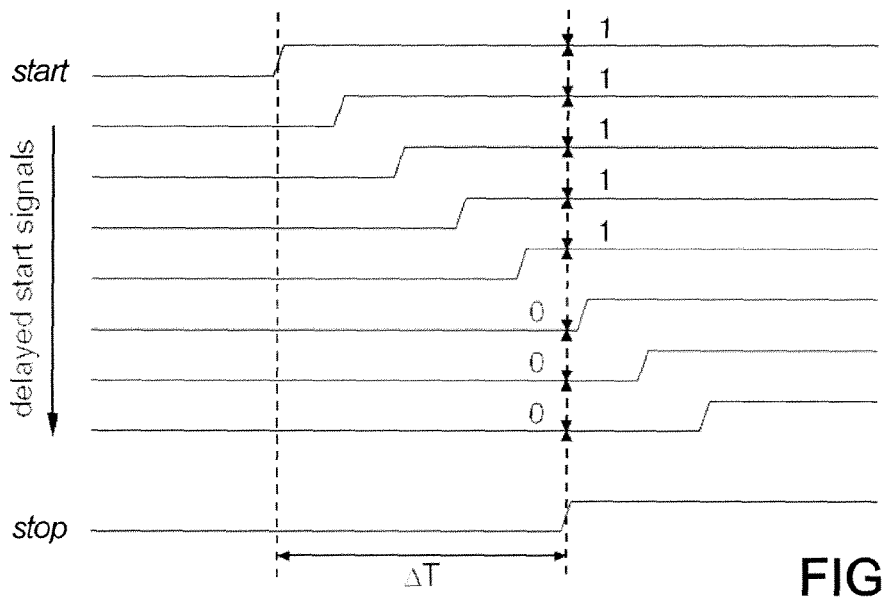
FIG. 3 is a timing diagram of a set of delayed versions of the start signal of the TDC of FIG. 1.

As shown in the timing diagram of FIG. 3, the time interval $\Delta T$ between the active edges of the start and stop signals is thus proportional to the number k of flip-flops that have been sampled in the HIGH value.

Overall, the start signal has propagated along the chain of delay elements, thus generating a number k of equally spaced versions of the start signal.

This gives a thermometer code, as all delay elements that have been already passed by the start signal give a HIGH value at the outputs of the corresponding sampling elements, whereas all delay elements which have not been passed by the start signal give a LOW value. The position of the HIGH to LOW transition in this thermometer code indicates how far the start signal could propagate during the time interval $\Delta T$ spanned by the start and the stop signal. Hence, this transition is a measure for the time interval $\Delta T$. Stated otherwise, the measurement of the time interval $\Delta T$ is related to the number of all sampling elements having a HIGH output upon arrival of the stop signal.

The TDC finally comprises a thermometric-to-digital converter 22 receiving as input the Q outputs of the sampling elements $S_1$-$S_Q$, and providing as output a binary value TDC_output, on a given number P of bits. This binary value is the TDC output value that is representative of the time interval $\Delta T$ between the start and the stop signals.

Usually, the TDC is built from delay elements, such as the logic gates $G_1$-$G_Q$, whose propagation delay exhibits a substantial dependency to their supply voltage VDD. Embodiments of the proposed solution rely on the idea of modulating the supply voltage by a dithering signal. Given that the principle of operation of any delay-line based TDC consists in expressing the time difference between the start and stop signals as a number of propagation delays introduced by the gates, modulating their supply voltage will result in a modulation of their conversion gain. Thus, introduction of an analog dithering signal into the time-to-digital conversion mechanism is achieved in an efficient way.

The supply voltage modulation is built in the digital domain, for instance by summing binary values of one or more periodic waveforms, for instance triangle signals.

Figure 4:
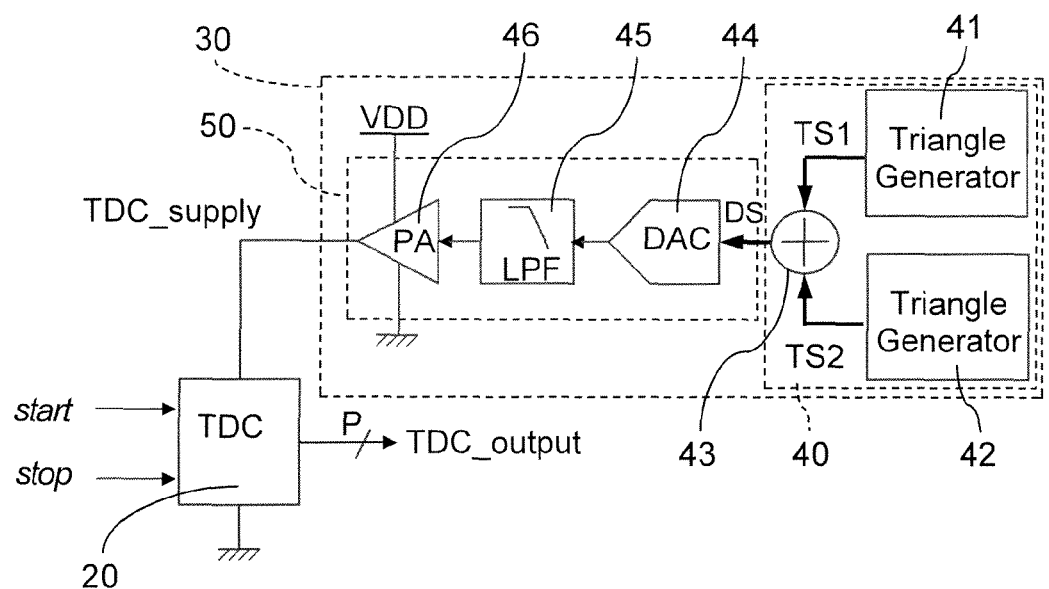
FIG. 4 is a schematic block diagram of the time-to-digital conversion device according to embodiments of the present invention.

With reference to the circuit diagram of FIG. 4, the time-to-digital conversion device according to some embodiments may be a standard TDC 20 as described above in connection with FIG. 2, and a dithering arrangement 30.

The dithering arrangement 30 may comprise a dithering signal generator 40 with at least two digital generators 41 and 42 adapted to generate triangle signals TS1 and TS2, respectively. Triangle signals are convenient examples of periodic waveforms for the purpose of the present embodiments, since they are easy to generate in the digital domain. They may be generated from look-up tables storing binary values. It will be appreciated, however, that any other periodic waveform(s) may be used in replacement of, or in addition to triangle signal(s).

In some embodiments, the amplitude and fundamental frequency of the periodic waveforms TS1 and TS2 may be programmable.

The dithering signal generator 40 as shown in FIG. 4 further comprises a digital summing circuit or adder 43, which is adapted to sum respective binary values of signals TS1 and TS2, and to output a digital dithering signal DS resulting from these additions.

One of ordinary skill in the art will appreciate that more generators like generators 41 and 42 may be used to generate more periodic waveforms like signals TS1 and TS2, respectively, which are summed in the adder 43 having additional inputs to that end. Also, it will be understood that other types of periodic signal generators may be used, such as, for example, sinus signal generators, square signal generators.

The dithering signal DS is input to a TDC supply voltage generator 50 comprising a Digital-to-Analog Converter (DAC) 44 of limited range, followed by a low-pass filter (LPF) 45 and a power stage or Power Amplifier (PA) 46. Generator 50 is adapted to generate a supply voltage TDC_supply with a low-enough impedance. In some embodiments, the LPF 45 may be programmable.

The TDC_supply voltage is generated by the power amplifier 46 from the supply voltage VDD with respect to the low pass filtered, analog translated dithering signal DS. It is used as supply voltage for the TDC 20 instead of the (normal) supply voltage VDD. Thus, the TDC_supply voltage provides dithering into the time-to-digital conversion mechanism through the TDC supply voltage modulation, which causes modulation of the delay introduced by the delay elements $G_1$-$G_Q$. To put it another way, the proposed dithering technique introduces noise by varying the time-to-digital conversion gain.

The noise power added by this dithering technique may have limited, controllable frequency range and power. This may be achieved, for instance, by controlling the number, frequency and/or amplitude of periodic waveforms like signals TS1 and TS2, which are added in adder 43. Stated otherwise, the dithering is added with a power-frequency spectrum that can be shaped so as to avoid any degradation of the TDC performance.

It will be appreciated that dithering according to the proposed embodiments, although being digitally controlled, is added in the analog domain, namely as a continuous wave, thanks to low-pass filtering. Therefore, it does not introduce new quantization and aliasing noise sources, as would dithering that would be added in the digital domain.

Figure 5:
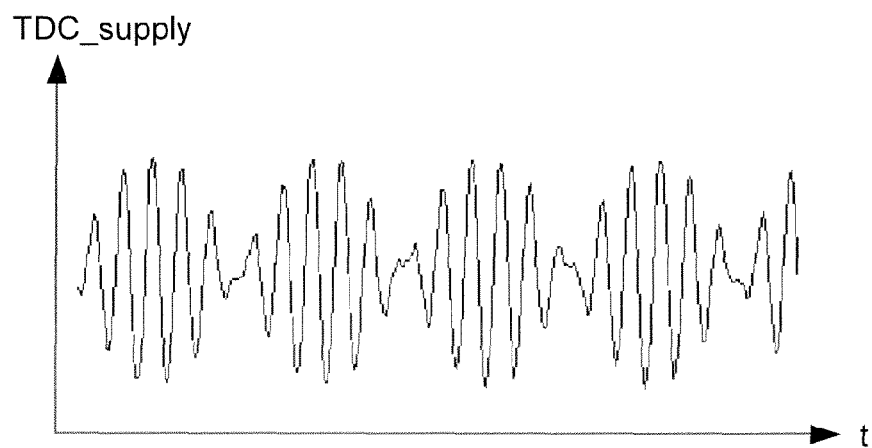
FIG. 5 is a timing diagram of the modulated TDC power supply generated by the device of FIG. 4.

As shown in the timing diagram of FIG. 5, the combination of the two tones respectively associated with the triangle signals TS1 and TS2 creates lower frequency beats. The specific shape of the TDC_supply voltage is not correlated to the fractional-N delta-sigma modulation patterns when the time-to-digital conversion device is used in a frequency synthesizer, and thus does not generate unwanted intermodulation tones.

Furthermore, when the device is used in a frequency synthesizer, further, the triangle signals frequencies can be chosen to fall outside of the PLL bandwidth, so as to benefit from the PLL loop filtering.

In other applications, the supply voltage modulation provides dithering that can be subsequently rejected in the digital domain.

Figure 6:
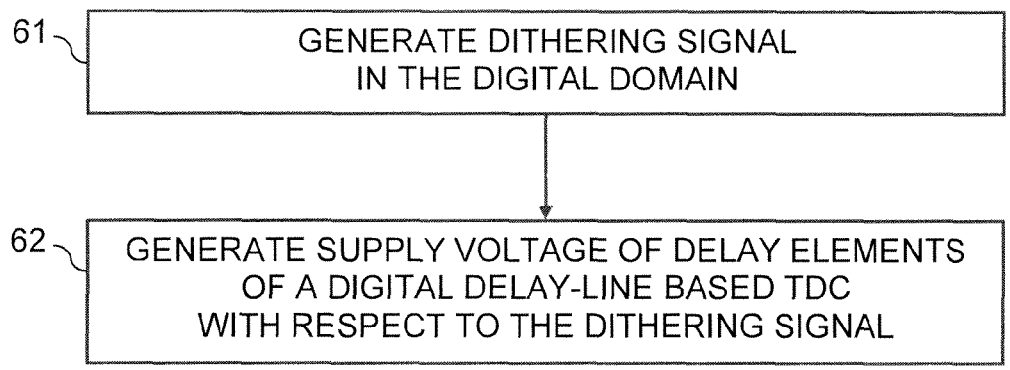
FIG. 6 is a flow chart illustrating steps of the time-to-digital conversion method according to embodiments of the present invention; and, FIG. 7 is schematic block diagram of a PLL based frequency synthesizer using the time-to-digital conversion device of FIG. 4.

With reference to the flow chart of FIG. 6, a method of time-to-digital conversion with analog dithering may comprise generating 61 the dithering signal DS in the digital domain; and generating 62 the supply voltage TDC_supply of the delay elements of the digital delay-line of the TDC, with respect to the dithering signal.

The dithering signal may be generated, in the digital domain, as the sum of the two periodic waveforms TS1 and TS2, or of more signals like these.

In some embodiments, the amplitude and/or fundamental frequencies of the periodic waveforms are programmable.

For instance, the dithering signal may be generated by summing respective binary values of the periodic waveforms.

In one example, the periodic waveforms may be triangle signals.

Furthermore, generating the supply voltage of the delay elements of the digital delay-line of the TDC supply voltage generator may comprise digital-to-analog converting of the dithering signal; low-pass filtering of the analog translated dithering signal; and generating the TDC supply voltage with respect to the low pass filtered analog translated dithering signal.

In one embodiment of the present invention, the low-pass filtering of the analog translated dithering signal may be carried out using a programmable low-pass filter.

The time-to digital conversion scheme as described in the above may be used, in a wide range of electronic devices. For instance, it may be used in Phase/Frequency Detector (PFD) circuits as found in, e.g., frequency synthesizers operating according to the principle of fractional Phase Locked Loop (PLL).

Frequency synthesizers are electronic systems adapted to generate any of a range of frequencies which depends on the application. They are found in many modern devices, including radio emitters for mobile telephones, radio-communication base stations, satellite receivers, GPS systems, and various other electronic applications.

Figure 7:
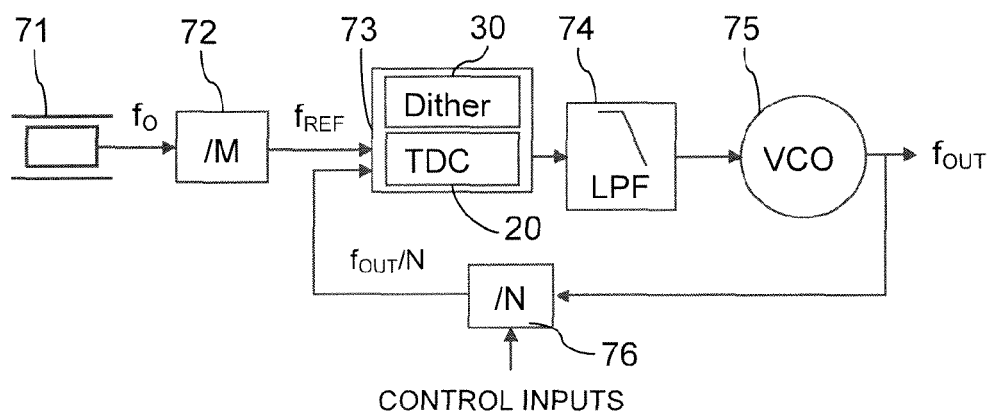

With reference to the circuit block diagram of FIG. 7, the basic elements and arrangement of a PLL based frequency synthesizer according to an embodiment of the present invention comprise a PFD circuit 73 that is adapted to compare the phases of two input signals, and to produce an error signal that is proportional to the difference between their phases. The error signal is then low pass filtered in a LPF 74, and used to drive a voltage-controlled oscillator (VCO) 75 that creates an output frequency $f_{OUT}$. The output frequency $f_{OUT}$ is fed through a frequency divider 76 back to one input of the PFD, producing a negative feedback loop. The frequency divider 76 is adapted to divide the output frequency four by a given number N to provide frequency at the input of the PFD. If the frequency $f_{OUT}/N$ shifts up or down, the phase error signal will decrease or increase, respectively, thus driving the output frequency $f_{OUT}$ of the VCO in the opposite direction so as to reduce the error. Thus, the output is locked to the frequency at the other input times N. This other input receives a fixed frequency, which is called the reference frequency $f_{REF}$. The reference frequency $f_{REF}$ may be derived from a crystal oscillator 71 generating a nominal frequency $f_0$ that is very stable, usually through a frequency divider 72 adapted to divide the nominal frequency $f_0$ by M, so that $f_{REF}=f_0/M$.

The ability of the frequency synthesizer to generate multiple frequencies stems from digital inputs controlling the frequency divider 76 placed between the output and the feedback input, namely the division factor N. The division factor N may be a fractional number.

According to some embodiments, the PFD comprises a time-to-digital conversion device as described above, namely having a standard TDC 20 whose supply voltage is generated by the supply voltage generator 450 as shown in FIG. 4. By supply voltage of the TDC 20, it should be understood that the voltage supplying the delay elements of the TDC, has a propagation delay that exhibits a dependency to a said supply voltage.

In one embodiment, the start signal input to the TDC 20 is the signal at the reference frequency $f_{REF}$, and the stop signal is the PLL feedback signal at the divided frequency $f_{OUT}/N$.

Another aspect of the present disclosure relates to a method of time-to-digital conversion with analog dithering, for converting a time interval between an active edge of a start signal and an active edge of a stop signal into a binary output value using a delay-line based TDC as previously described.

Expressions such as "comprise", "include", "incorporate", "contain", "is" and "have" are to be construed in a non-exclusive manner when interpreting the description and its associated claims, namely construed to allow for other items or components that are not explicitly defined also to be present. Reference to the singular is also to be construed in be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

One of ordinary skill in the art will recognize that the boundaries between logic blocks are merely illustrative and that alternative embodiments may merge logic blocks or circuit elements or impose an alternate decomposition of functionality upon various logic blocks or circuit elements. For instance, in the example of circuit diagram as shown in FIG.

4, the low-pass filter 45 and the power stage 46 are depicted as separate functional blocks, but the one with ordinary skills in the art will appreciate that a single amplifier and integrator stage, e.g. an operational-amplifier based integrator with conveniently chosen gain, can achieve both functions simultaneously.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

The invention claimed is:

1. A time-to-digital conversion device with analog dithering, configured to convert a time interval between an active edge of a first signal and an active edge of a second signal into a binary output value, comprising:
    a time-to-digital converter, TDC, comprising:
        an arrangement of a number Q of cascaded delay elements ($G_1$-$G_Q$) each having a propagation delay that exhibits a dependency to a supply voltage, the arrangement receiving the first signal in input;
        a set of Q sampling elements configured to generate Q sample values by sampling respective outputs of the Q delay elements responsive to the active edge of a second signal;
        an encoder configured to generate the binary output value (TDC_output) from the Q sample values; and
    a dithering arrangement comprising:
        a digital dithering signal generator, configured to generate a dithering signal (DS) in the digital domain; and
        a supply voltage generator configured to generate the supply voltage of the delay elements of the TDC, with respect to the dithering signal.

2. The device according to claim 1, wherein the dithering signal generator is configured to generate the dithering signal as a sum of at least two periodic waveforms (TS1,TS2) in the digital domain.

3. The device according to claim 2, wherein an amplitude and/or fundamental frequencies of the periodic waveforms are programmable.

4. The device according to claim 2, wherein the dithering signal generator comprises digital generators configured to provide binary values of the periodic waveforms, respectively, and a digital summing circuit configured to generate the dithering signal by summing respective binary values of the periodic waveforms.

5. The device according to claim 2, wherein the periodic waveforms are triangle signals.

6. The device according to claim 1, wherein the supply voltage generator comprises:
    a Digital-to-Analog Converter (DAC), coupled to the dithering signal generator for receiving the dithering signal;
    a low-pass filter coupled to the DAC configured to receive an analog translated dithering signal; and
    a power stage coupled to the low-pass filter and configured to generate the TDC supply voltage with respect to the low pass filtered analog translated dithering signal.

7. The device of claim 6, wherein the low-pass filter is programmable.

8. A method of time-to-digital conversion with analog dithering, for converting a time interval between an active edge of a first signal and an active edge of a second signal into a binary output value using a time-to-digital converter (TDC) comprising:
    an arrangement of a number Q of cascaded delay elements ($G_1$-$G_Q$) each having a propagation delay that exhibits a dependency to a supply voltage, the arrangement receiving the first signal in input;
    a set of Q sampling elements configured to generate Q sample values by sampling respective outputs of the Q delay elements responsive to the active edge of a second signal; and
    an encoder configured to generate the binary output value (TDC_output) from the Q sample values;
the method comprising:
    generating a dithering signal (DS) in a digital domain; and
    generating the supply voltage of the delay elements of the TDC, with respect to the dithering signal.

9. The method of claim 8, wherein the dithering signal is generated as a sum of at least two periodic waveforms (TS1, TS2) in the digital domain.

10. The method of claim 9, wherein an amplitude and/or fundamental frequencies of the periodic waveforms are programmable.

11. The method of claim 9, wherein the dithering signal is generated by summing respective binary values of the periodic waveforms.

12. The method of claim 9, wherein the periodic waveforms are triangle signals.

13. The method of claim 8, wherein generating the supply voltage of the delay elements of the TDC supply voltage generator comprises:
    digital-to-analog converting the dithering signal;
    low-pass filtering the analog translated dithering signal; and
    generating the TDC supply voltage with respect to the low pass filtered analog translated dithering signal.

14. The method of claim 13, wherein low-pass filtering the analog translated dithering signal is carried out using a programmable low-pass filter.

15. A phase-locked-loop based frequency synthesizer comprising a phase/frequency detector circuit comprising a time-to-digital conversion device with analog dithering according to claim 1.

* * * * *